United States Patent [19]

Shou et al.

[11] Patent Number: 5,740,096
[45] Date of Patent: Apr. 14, 1998

[54] FILTER CIRCUIT FOR COMMUNICATION

[75] Inventors: Guoliang Shou; Changming Zhou; Makoto Yamamoto, all of Tokyo; Mamoru Sawahashi; Fumiyuki Adachi, both of Kanagawa; Sunao Takatori, Tokyo, all of Japan

[73] Assignees: NTT Mobile Communications Network, Inc.; Yozan, Inc., both of Tokyo, Japan

[21] Appl. No.: 708,986

[22] Filed: Sep. 6, 1996

[30] Foreign Application Priority Data

Sep. 8, 1995 [JP] Japan ................................. 7-255758

[51] Int. Cl.[6] ..................................................... G06G 7/02
[52] U.S. Cl. .............................................................. 364/825
[58] Field of Search ............................... 364/825, 724.11, 364/717

[56] References Cited

U.S. PATENT DOCUMENTS 4,507,746  3/1985  Fletcher, Jr. .

OTHER PUBLICATIONS

Povey et al., "Simplified Matched Filter Receiver Designs for Spread Spectrum Communications Applications", Electronics & Communication Engineering Journal, vol. 5, No. 2, Apr. 1, 1993.

Nauerz, "The Suitability of Modern CMOS Gate Array Circuits as Correlations and Matched Filters for Spread-Spectrum Signals", Crisis Communications, vol. 2 of 3, Oct. 1987.

Tanaka et al., Development of Low Power Consumption LSI for SS Communication, Technical Report of IEICE, SST95–77, Oct. 1995.

Ogawa et al., Development of 1 Chip SS Communication LSI Using Digital Matched Filters, Technical Report of IEICE, ISEC94–42, SST94–65, Dec. 1994.

Dual 64–TAP, 11 Mcps Digital Matched Filter/Correlator STEL–3310, Stanford Communications, 1990.

Tachika et al., A Development Conditions and Its Technical Issue of Digital Matched Filters in Spread-Spectrum Communication Systems, Technical Report of IEICE, SST92–21, 1992.

Primary Examiner—Tan V. Mai
Attorney, Agent, or Firm—Cushman, Darby & Cushman IP Group of Pillsbury Madison & Sutro LLP

[57] ABSTRACT

The present invention has an object to provide a filter circuit for communication generative an effective digital output as well as an analog output in a filter circuit of low electric power consumption. The function speed of an A/D converting circuit is minimized by intermittently holding an analog output signal according to an experience that peak detection can be performed by partially sampling the signal after the acquisition.

2 Claims, 8 Drawing Sheets

FILTER CIRCUIT FOR COMMUNICATION

FIELD OF THE INVENTION

The present invention relates to a filter circuit for communication, especially to a matched filter effective for a spread spectrum communication system for the mobile cellular radio and wireless LAN.

BACKGROUND OF THE INVENTION

A matched filter is a filter for judging the identification between two signals. In the spread spectrum communication, each user who receives a signal processes a received signal by a matched filter using spreading code allocated for the user so as to find a correlation peak for acquisition and holding.

Here, assuming that a spreading code is d(i), sampling interval is Δt, a length of spreading code is N, a received signal before a time t is x(t-iΔt), a correlation output y(t) of matched filter is as in formula (1). In formula (1), d(i) is a data string of 1 bit data.

$$y(t) = \sum_{i=0}^{N-1} d(i)x(t - i\Delta t) \quad (1)$$

A conventional matched filter circuit is described here. In an accumulation circuit of a digital matched filter in FIG. 16, digitized input signal X is held in a shift register SFT-REG and shifted, then, a multiplier registered in a register REG is multiplied to the input signal on the predetermined sample timing by a plurality of digital multiplying portions DM. The outputs of multiplying portions are added by the digital adder DAD. These operations correspond to the formula (1). For the acquisition, double or higher order of sampling is necessary. In such a case, the circuit in FIG. 16 is plurally structured. Consequently, the size of the whole circuit was large and consumed much electric power. It is a serious defect. Though a circuit of SAW device was used, the total circuits cannot be incorporated within one LSI and S/N ratio was low.

The applicant of the present invention proposes a matched filter circuit by an analog circuit in FIG. 17. The electric power consumption was reduced by a circuit with a multiplier and an adder of voltage driven type using a capacitive coupling. However, a digital output is also necessary as an output of a matched filter because conventional digital communication will be also used for the present.

SUMMARY OF THE INVENTION

The present invention solves the above conventional problems and has an object to provide a filter circuit for communication generative an effective digital output as well as an analog output in a filter circuit of low electric power consumption.

In a matched filter circuit according to the present invention, the function speed of an A/D converting circuit is minimized by intermittently holding an analog output signal according to an experience that peak detection can be performed by partially sampling the signal after the acquisition.

It is possible to use a circuit of rather low speed as an A/D converting circuit by the matched filter circuit according to the present invention. Therefore, it is profitable considering the cost, yield and electric power consumption.

PREFERRED EMBODIMENT OF THE PRESENT INVENTION

Hereinafter, the first embodiment of a matched filter according to the present invention is described with reference to the attached drawings.

Figure 1:
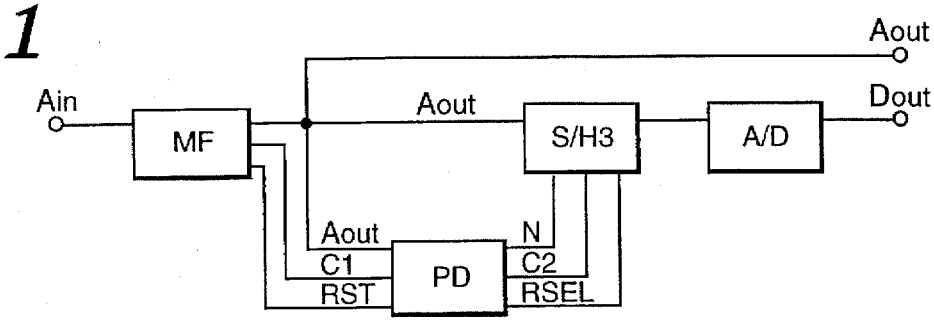
FIG. 1 shows a matched filter circuit according to the present invention.
Figure 17:
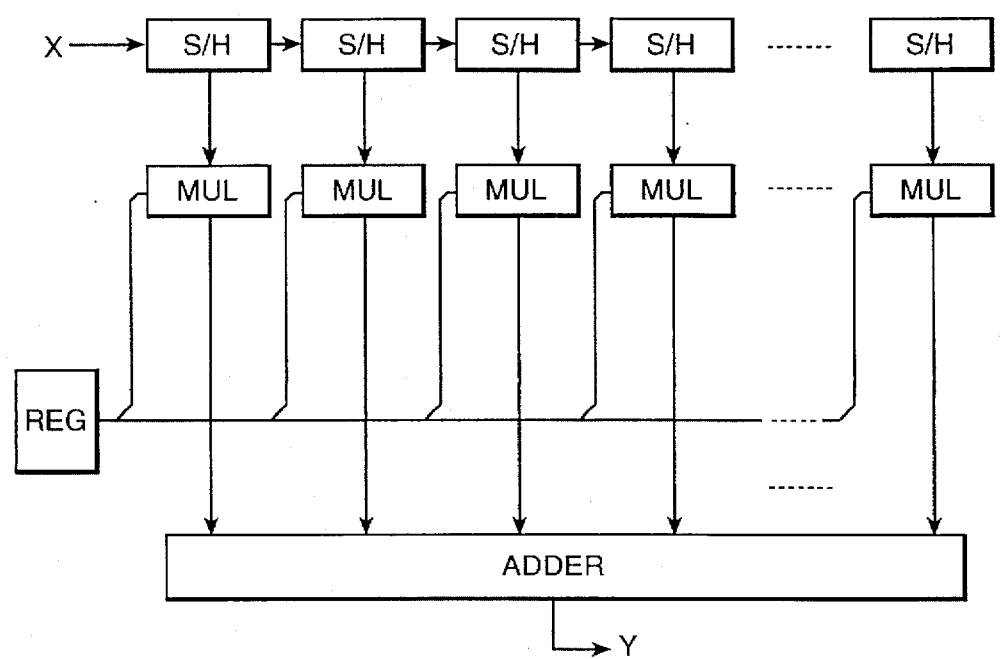
FIG. 17 shows a block diagram of proposed analog matched filter.

In FIG. 1, a matched filter includes a sampling and holding circuit "S/H3" for holding an analog output signal of the circuit "MF" for addition and multiplication and A/D converting portion "A/D" for digitizing an analog output signal Aout from the sampling and holding circuit at the next stage to the circuit "MF" in FIG. 17. The sampling and holding circuit is controlled by a peak detector "PD". Accumulating portion outputs a clock signal C1 for deciding the timing of holding data of an inside sampling and holding circuit and a reset signal RST for showing the timing of holding data of the first sampling and holding circuit to the peak detector PD. The peak detector controls S/H3 according to the signals.

The peak detector outputs a clock C2 corresponding to C1 and a signal N indicating a number of a datum to be held (i in the formula (1)) by the sampling and holding circuit S/H3. A plurality of Ns can be output up to a predetermined number, for example three. Each number is once registered in a register in the sampling and holding circuit (not shown in FIG. 1), a register selecting signal RSEL for the registration is input from PD to S/H3.

Figure 2:
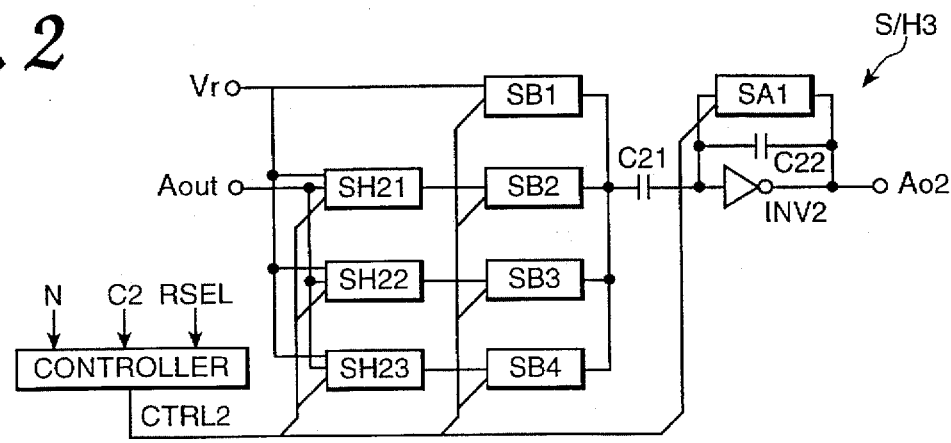
FIG. 2 shows a sampling and holding circuit in the first embodiment of the present invention.
Figure 3:
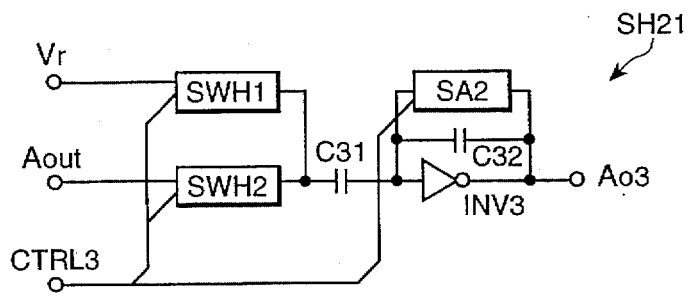
FIG. 3 shows a shows one sampling and holding circuit in a sampling and holding circuit.

In FIG. 2, the sampling and holding circuit S/H3 includes a plurality of sampling and holding circuits SH21, SH22 and SH23 for holding Aout of an output of accumulating portion by an appropriate timing. The outputs of the sampling and holding circuits are connected to switches SB2, SB3 and SB4, respectively. When a supply voltage is Vdd, the reference voltage Vr of Vdd/2 is input to each sampling and holding circuit, and Vr is input to a switch SB1 arranged in parallel with the switches above. Outputs of SB1 to SB4 are input to a capacitance S21 in parallel, and an output of a capacitance C21 is input to an inverted amplifier INV2. An output of the inverted amplifier INV2 is fed back to the input through a capacitance C22. The outputs of SB1 to SB4 are output as analog output signal Ao2 with a good linearity.

SH21 to SH23 and SB1 to SB4 are controlled by controlling signal STRL2 from a controller (shown by "CONTROLLER" in FIG. 2). In the controller, a plurality of registers corresponding to a plurality of peaks of multipass are set, and the timing to input data, that is, the number showing the location of a peak in the data ("a peak number", hereinafter) can be registered by it. A register selecting signal RSEL, a peak number signal N and a register writing clock C2 are input to the controller from the peak detector PD, and the peak number of each register is written.

In an inverted amplifying portion INV2, a switch SA1 is settled for connecting the input and output. An offset voltage of the input of the inverted amplifying portion INV2 can be refreshed by closing SA1. High accuracy of outputs of sampling and holding circuit can be surely obtained by the refresh.

Switches SB2 to SB4 are closed at the timing when Aout held in SH21 to SH23 are to be output to the next stage, and SB1 is closed when INV2, C21 and C22 are refreshed.

The sampling and holding circuit SH21 includes switches SWH1 and SWH2 connected Aout and Vr, respectively. Outputs of the switches are input to inverter INV3 through capacitance C31, similar to the case of S/H3. An input and an output of the inverter INV3 are connected with each other parallelly by a capacitance C32 and a switch SA2. The sampling and holding circuit SH21 is controlled by a control signal CTRL3 to take and hold Aout for an electrical charge of C31 and C32 at the timing SWH2 is opened. Good linearity of the output of the sampling and holding circuit is guaranteed by a high gain of INV3 and the feedback of C32. SH22 and SH23 are structured similarly to SH21.

Figure 4:
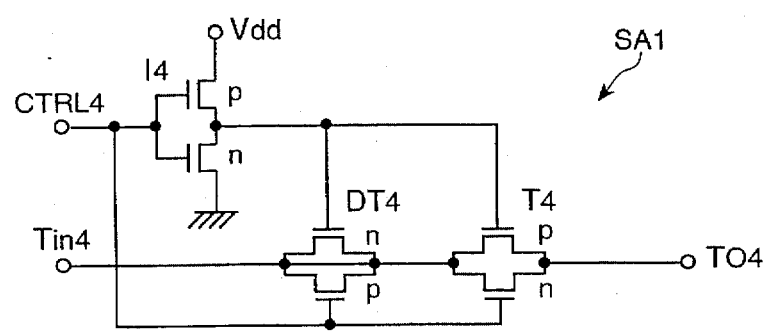
FIG. 4 shows a circuit of the first type switch in the embodiment.

In FIG. 4, the switch SA1 is structured by connecting in serial a MOS transistor T4 and a dummy transistor DT4 (about half size of T4) with inverse polarity of that of T4. To the gate, a controlling signal CTRL4 and a signal inverted by an in.letter I4 are input, and an input Tin4 is conducted to an output To4 when CTRL is high level. DT4 is connected to the input of INV2, that is to a capacitance C21 in the state of floating, so as to cancel out the influence of residual electric charge of C21 on refreshing by inverse polarity of DT4. Therefore, it is prevented that the output becomes inaccurate because of the influence of switch SA1. As SA2 is the same structure as SA1, it is omitted to be shown in a figure. Switches SA . . . described below also have the same structure.

Figure 5:
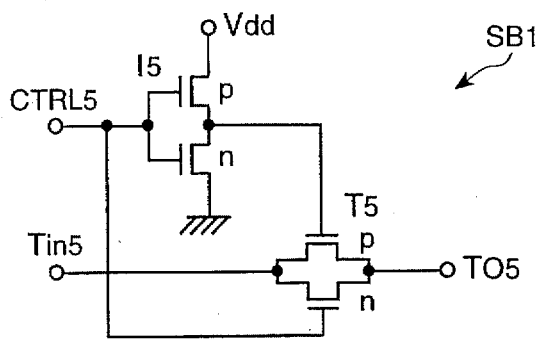
FIG. 5 shows a circuit of the second type switch in the embodiment.

In FIG. 5, a switch SB1 has MOS transistor T5 to which a control signal CTRL5 and a signal inverted by an inverter I5 are input at its gate. When CTRL is high level, an input Tin5 is conducted to an output To5. As SB2 to SB4 are same as SB1, they are not shown in a figure. Switches SB . . . described below also have the same structure.

Figure 6:
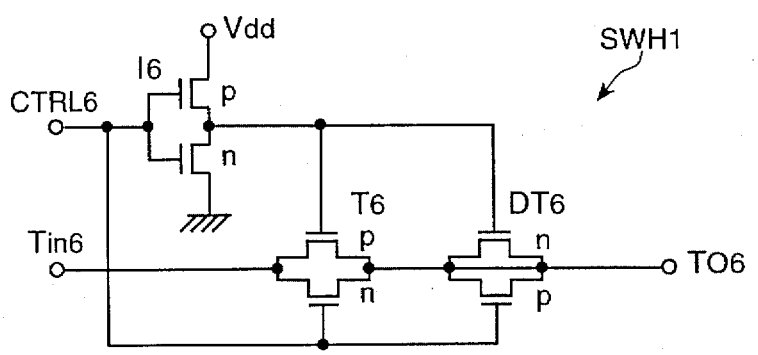
FIG. 6 shows a circuit of the third type switch in the embodiment.

In FIG. 6, in the switch SWH1, CMOST6 and dummy transistor DT6 (about half size of T6) with inverse polarity are connected in serial. A control signal CTRL6 and a signal inverted by an inverter 16 are input to the gate of the switch SWH1: an input Tin6 is conductive toward an output of To6 when CTRL6 is high level. DT6 is connected to the output, that is to a capacitance C31 in the state of floating, so as to cancel out the influence of residual electric charge of C31 on refreshing by inverse polarity of DT6. Therefore, it is prevented that the output becomes inaccurate because of the influence of switch SWH1. As SWH2 is the same structure as SA1, it is omitted to be shown in a figure.

Figure 18:
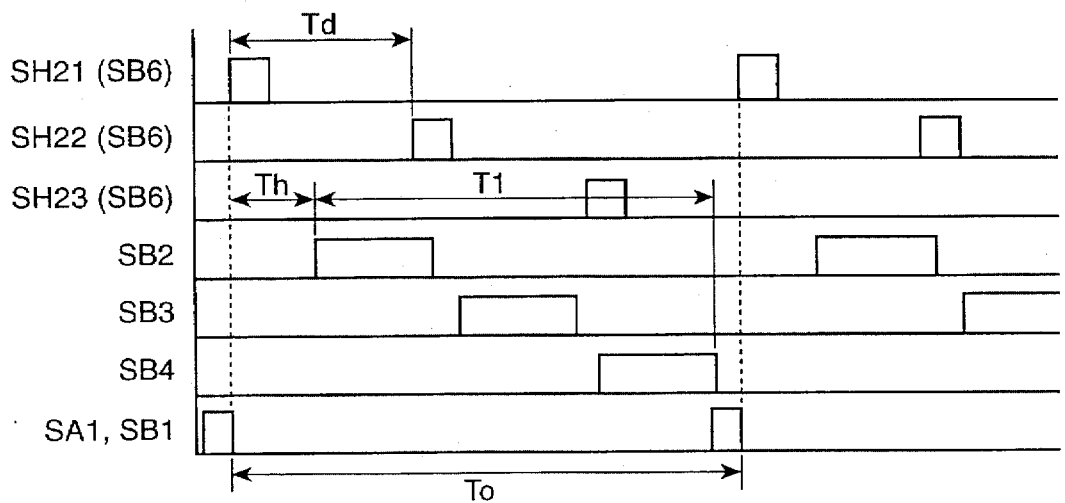
FIG. 18 shows a timing chart of the timing of action of the sampling and holding circuit.

The timing of sampling and holding by the sampling and holding circuit S/H3 is shown in FIG. 18. After a predetermined time Th from when the signal is input to SH21, data of SH21 is output from SB2. Before completion of data output, SH22 starts to take in data, and data of SB3 is output after it. After holding data in SH23, data is output from SB4. Cyclic period Tc of the sampling and holding is given from a starting point of the beginning of taking data by SH21as in FIG. 18. Assuming the time distance from beginning of output by SB2 to the completion of it by SB4 to be T1, the time (Th+T1) is settled shorter than Tc. The circuit is refreshed by switches SA1 and SB1 within the time {Tc−(Th+T1)}.

The embodiment above is the case that three peaks are detected and all the circuits in a sampling and holing circuit is used. In the case of fewer peaks, for example two peaks are detected, the timing is as in FIG. 19.

Figure 19:
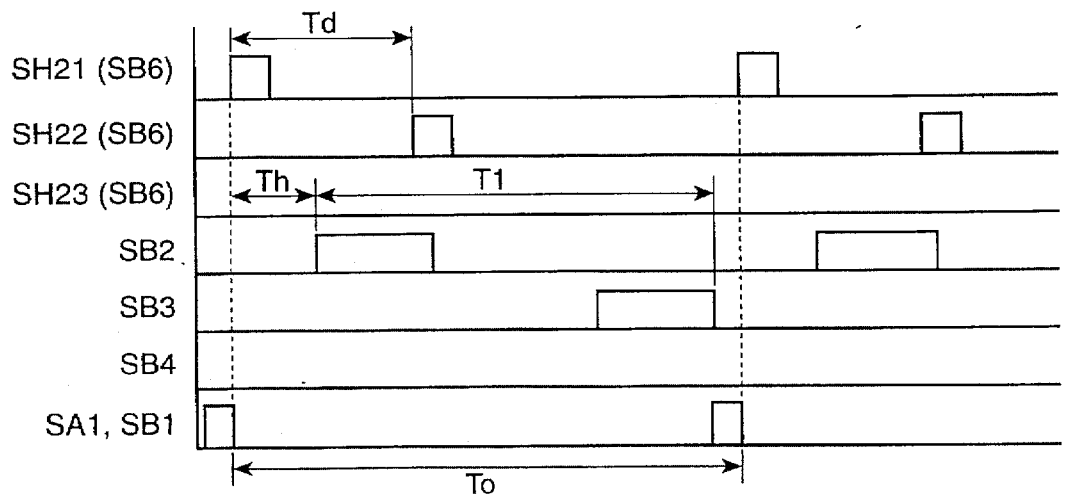
FIG. 19 shows a timing chart of the timing of another action of the sampling and holding circuit.

In FIG. 19, the time distance Td from taking data by SH21 to that by Sh22 and the time distance Th from taking data by SH21 to the output by SB2 are settled similarly to that in FIG. 18. Also an output period T1 is settled similarly to that of FIG. 18.

Figure 7:
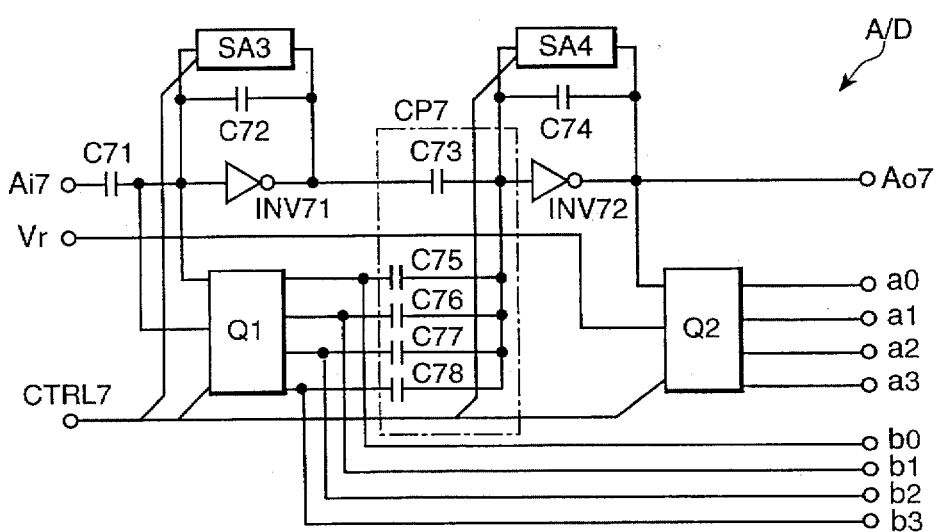
FIG. 7 shows a circuit of an A/D converter in the embodiment.

In FIG. 7, an A/D converter includes the first quantizing circuit Q1 to which an output of S/H3 (Ai7 in FIG. 7) is input and the second quantizing circuit Q2 to which an output of Q1 and inverse output of Ai7 are input. Upper bits and lower bits are generated in Q1 and Q2, respectively.

Figure 8:
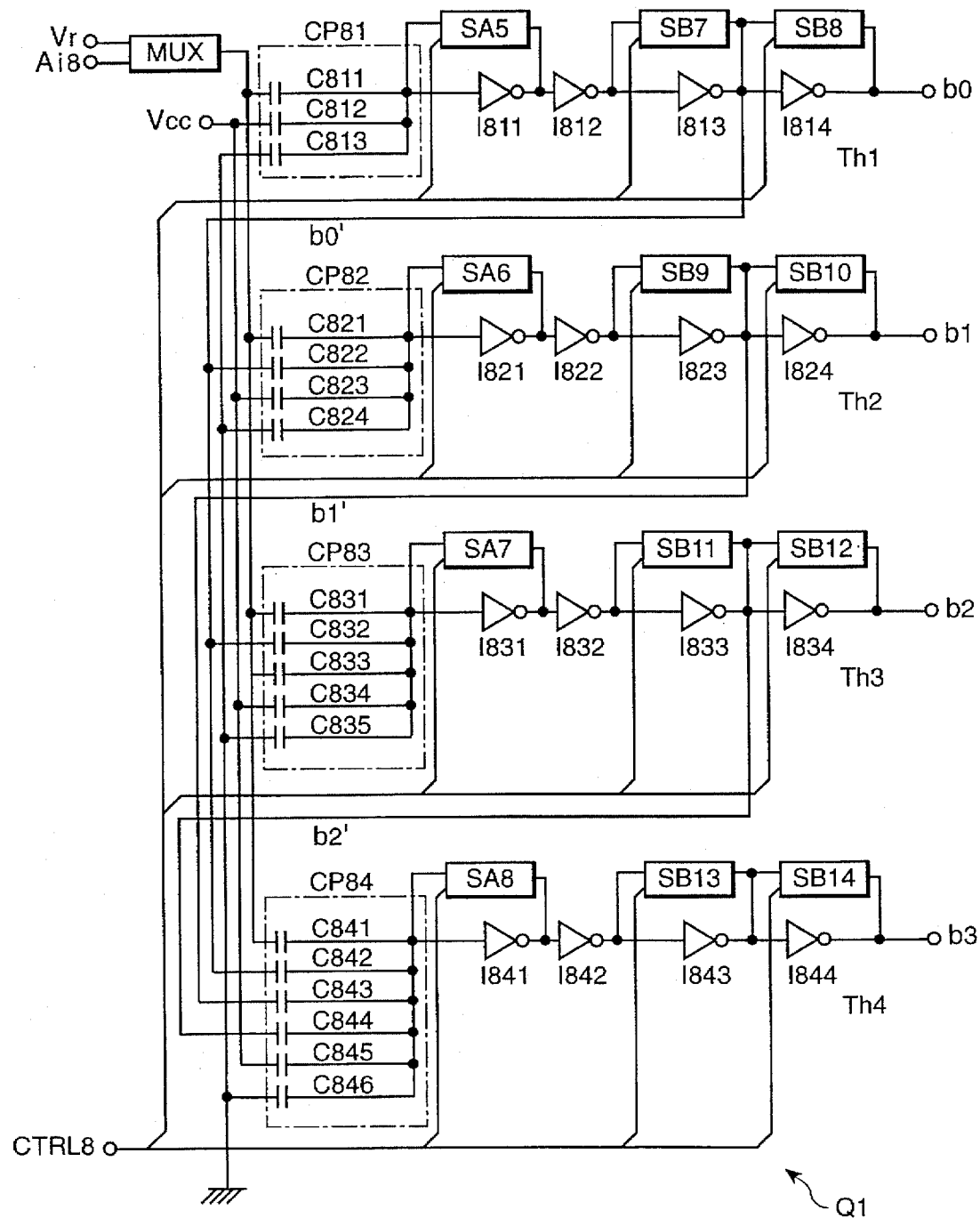
FIG. 8 shows a circuit of the A/D converter in FIG. 7.

Quantizing circuit Q1 includes four stages of thresholding circuits Th1, Th2, Th3 and Th4 as in FIG. 8. b0', b1' and b2' of inverse outputs of b0 to b2 of each thresholding circuit of upper three stages are generated as inside intermediate data.

Th4 of the lowest thresholding circuit includes a capacitive coupling CP84 to which input signals Ai8, b0', b1' and b2' are input, and four stages of MOS inverters I841, I842, I843 and I844. An output of CP84 is connected to I841. The signal b3 is generated as an output of I844. In CP84, capacitances C841, C842, C843 C844, C845 and C846 are connected in parallel, to which input signals Ai8, b0', b1', b2', supply voltage Vcc (=Vdd) and the ground are connected, respectively. Ai8 is input to C841 through multiplexer MUX which input Ai8 or the reference voltage Vr to C841, alternatively.

Th3 of the second digit from the lowest thresholding circuit includes a capacitive coupling CP83 to which the input signals Ai8, b0', and b1' are input, and four stages of MOS inverters I831, I832, I833 and I834. An output of CP83 is connected to I831. The signal b3 is generated as an output of I834. In CP83, capacitances C831, C832, C833, C834 and C835 are connected in parallel, to which input signals Ai8, b0', b1', supply voltage Vcc and the ground are connected, respectively. Ai8 is input to C831 through multiplexer MUX which input Ai8 or the reference voltage Vr to C831, alternatively.

Th2 of the third digit from the lowest thresholding circuit includes a capacitive coupling CP82 to which the signals Ai8 and b0' are input, and four stages of MOS inverters I821, I822, I823 and I824. An output of CP82 is connected to I821.

The signal b1 is generated as an output of I824. In CP82, capacitances C821, C822, C823 and C824 are connected in parallel, to which input signals Ai8, b0', supply voltage Vcc and the ground are connected, respectively. Ai8 is input to C821 through multiplexer MUX which input Ai8 or the reference voltage Vr to C821, alternatively.

Th1 of the upper thresholding circuit includes a capacitive coupling CP81 to which the signal Ai8 is input and four stages of MOS inverters I811, I812, I813 and I814. An output of CP81 is connected to I811. The signal b0 is generated as an output of I814. In CP81, capacitances C811, C812, and C813 are connected in parallel, to which input signal Ai8, supply voltage Vcc and the ground are connected, respectively. Ai8 is input to C811 through multiplexer MUX which input Ai8 or the reference voltage Vr to C811, alternatively.

The capacities of CP81 to CP84 are shown in TABLE 1, and outputs b0, b1, b2 and b3 in response to input signal Ai8 are shown in TABLE 2.

TABLE 1

| CAPACITIVE COUPLING | CAPACITANCE | CAPACITY |
|---|---|---|
| CP84 | C841 | 16Cu |
|  | C842 | 8Cu |
|  | C843 | 4Cu |
|  | C844 | 2Cu |
|  | C845 | Cu |
|  | C846 | Cu |
| CP83 | C831 | 16Cu |
|  | C832 | 8Cu |
|  | C833 | 4Cu |
|  | C834 | 2Cu |
|  | C835 | 2Cu |
| CP82 | C821 | 16Cu |
|  | C822 | 8Cu |
|  | C823 | 4Cu |
|  | C824 | 4Cu |
| CP81 | C811 | 16Cu |
|  | C812 | 8Cu |
|  | C813 | 8Cu |

TABLE 2

| INPUT VOLTAGE | INNER INTERMEDIATE OUTPUT | | | | OUTPUT | | | |
|---|---|---|---|---|---|---|---|---|
| Vi8 | b3' | b2' | b1' | b0' | b3 | b2 | b1 | b0 |
| $0 \leq Vi8 < Va$ | Vdd | Vdd | Vdd | Vdd | 0 | 0 | 0 | 0 |
| $Va \leq Vi8 < 2Va$ | 0 | Vdd | Vdd | Vdd | Vdd | 0 | 0 | 0 |
| $2Va \leq Vi8 < 3Va$ | Vdd | 0 | Vdd | Vdd | 0 | Vdd | 0 | 0 |
| $3Va \leq Vi8 < 4Va$ | 0 | 0 | Vdd | Vdd | Vdd | Vdd | 0 | 0 |
| $4Va \leq Vi8 < 5Va$ | Vdd | Vdd | 0 | Vdd | 0 | 0 | Vdd | 0 |
| $5Va \leq Vi8 < 6Va$ | 0 | Vdd | 0 | Vdd | Vdd | 0 | Vdd | 0 |
| $6Va \leq Vi8 < 7Va$ | Vdd | 0 | 0 | Vdd | 0 | Vdd | Vdd | 0 |
| $7Va \leq Vi8 < 8Va$ | 0 | 0 | 0 | Vdd | Vdd | Vdd | Vdd | 0 |
| $8Va \leq Vi8 < 9Va$ | Vdd | Vdd | Vdd | 0 | 0 | 0 | 0 | Vdd |
| $9Va \leq Vi8 < 10Va$ | 0 | Vdd | Vdd | 0 | Vdd | 0 | 0 | Vdd |
| $10Va \leq Vi8 < 11Va$ | Vdd | 0 | Vdd | 0 | 0 | Vdd | 0 | Vdd |
| $11Va \leq Vi8 < 12Va$ | 0 | 0 | Vdd | 0 | Vdd | Vdd | 0 | Vdd |

TABLE 2-continued

| INPUT VOLTAGE | INNER INTERMEDIATE OUTPUT | | | | OUTPUT | | | |
|---|---|---|---|---|---|---|---|---|
| $12Va \leq Vi8 < 13Va$ | Vdd | Vdd | 0 | 0 | 0 | 0 | Vdd | Vdd |
| $13Va \leq Vi8 < 14Va$ | 0 | Vdd | 0 | 0 | Vdd | 0 | Vdd | Vdd |
| $14Va \leq Vi8 < 15Va$ | Vdd | 0 | 0 | 0 | 0 | Vdd | Vdd | Vdd |
| $15Va \leq Vi8 < 16Va$ | 0 | 0 | 0 | 0 | Vdd | Vdd | Vdd | Vdd |

Cu in TABLE 1 is not necessary to be the minimum capacity, it is all right if it is common to each capacitive coupling. In TABLE 2, the voltage (Vdd/16) is indicated as Va.

The outputs from b0 to b3 are generated by the quantizing circuit Q1 above. Signals b0 to b3 are binary weighted by the capacitive coupling CP7 in FIG. 7 and added to an inverse output of the Ai7. Ai7 is input to C73 through inverted amplifying portion INV71 whose output is fed back to its input through the capacitance C72. The output of the inverted amplifier is $-Ai7$ (C71/C72), where it is settled that C71=C72. An output of capacitive coupling CP7 is input to Q2 through inverted amplifying portion INV72 whose output is fed back to its input through the capacitance C74. In the capacitive coupling CP7, capacitances C73, C75, C76 C77, C78 are connected in parallel, and $-Ai7$, b0, b1, b2 and b3 are connected to the capacitances. The ratio of the capacities in C74 and CP7 is; C73:C74:C75:C76:C77:C78= 16:1:8:4:2:1. The quantizing circuit Q2 is structured similar to that of Q1, the description of Q2 is omitted.

Figure 9:
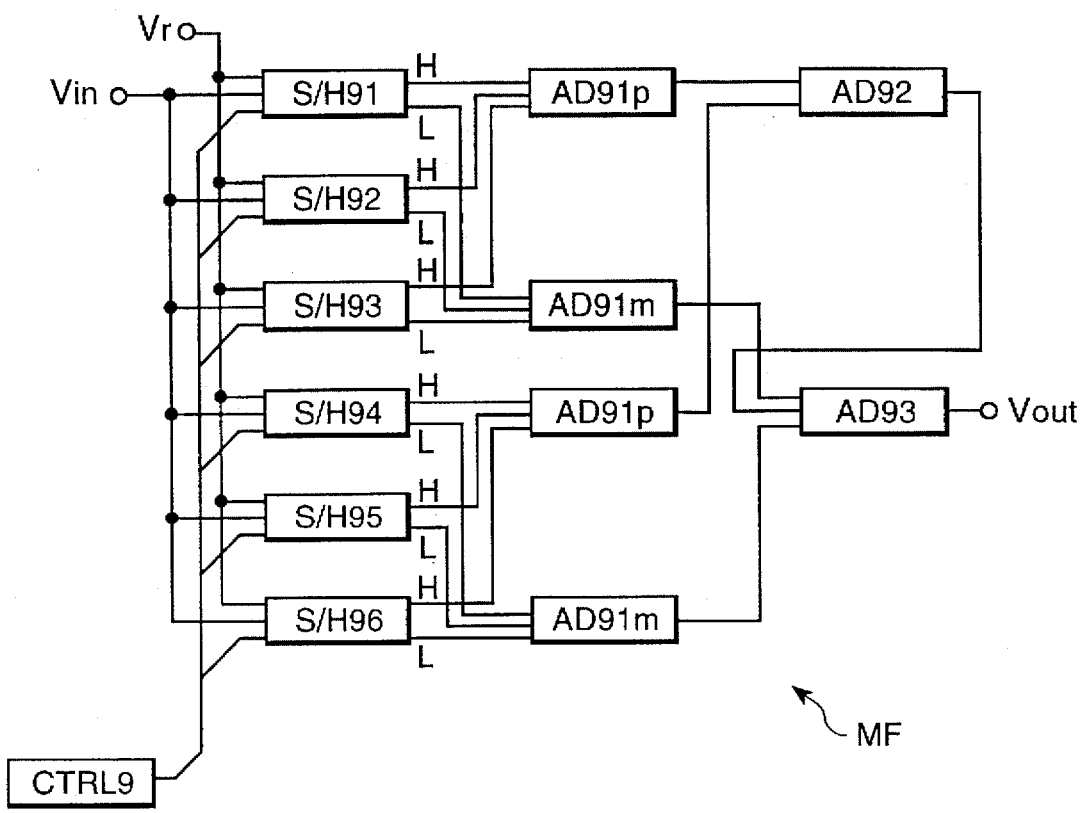
FIG. 9 shows a shows an accumulation circuit in the embodiment.

In FIG. 9, in accumulation circuit MF, an input voltage Vin (a voltage referencing the reference voltage Vr) is connected in parallel to a plurality of sampling and holding circuits S/H91 to S/H96. Two types outputs of H (high) and L (low) are output from each sampling and holding circuit. A control circuit CTRL9 is connected to the sampling and holding circuits, which controls the connection of Vin in order that Vin is successively input to one of sampling and holding circuits.

In the sampling and holding circuits, input voltage Vin is introduced to one of H and L, and the reference voltage Vr is connected to the other according to the control circuit. This selection of route is performed corresponding to 1 bit code to be multiplied to an input signal. Then, the multiplication is completed.

Figure 10:
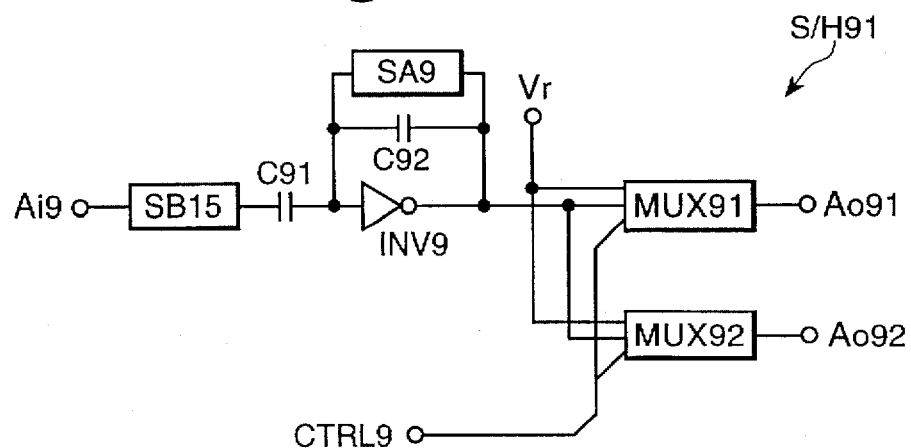
FIG. 10 shows a sampling and holding circuit in the accumulation circuit in FIG. 9.

Sampling and holding circuits from S/H91 to S/H96 (They are represented by S/H91 in the FIG. 10.) are structured as in FIG. 10, in which input voltage Vin is connected to a switch SB15 similar to SB1. An output of switch SB15 is connected to the capacitance C91 whose output is connected to inverted amplifying portion INV9. An output of INV9 is input to two multipliers MUX91 and MUX92. The common reference voltage Vr is connected to the multiplexers. When SB15 is closed, C91 is charged by the electrical charge corresponding to Ai9 and the linearity of the output is guaranteed by INV9. When the switch SB15 is opened after it, the sampling and holding circuit S/H91 holds Ai9.

Figure 11:
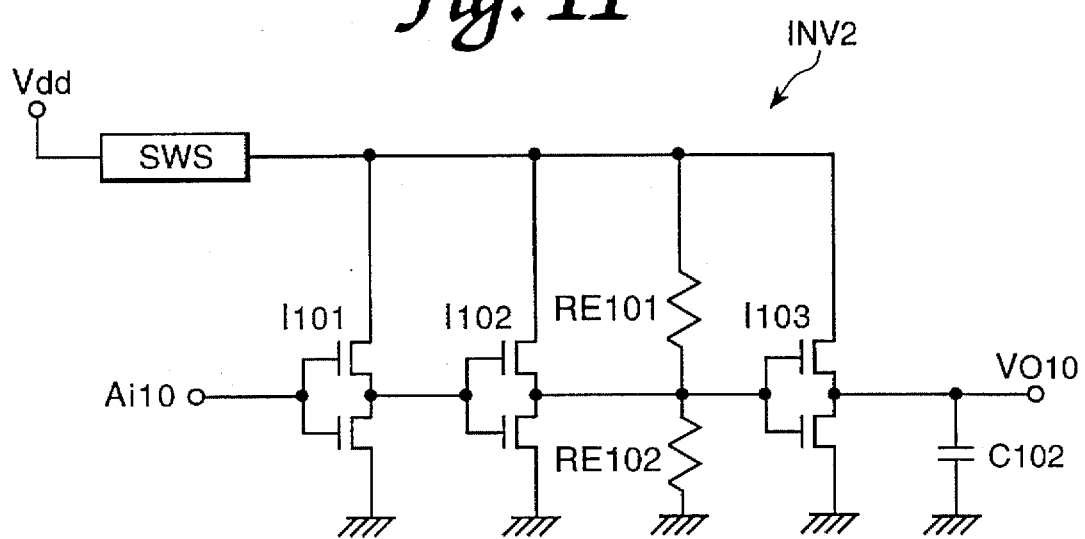
FIG. 11 shows a circuit of an inverted amplifying portion included in the embodiment.

The structure of the inverted amplifying portion INV2 is as in FIG. 11. An input voltage Ai10 is input to three serial MOS inverters I101, I102 and I103. Vo10 of an output of the last stage MOS inverter I103 is connected to an input of the first stage capacitance I101 through the feedback capacitance C22 (in FIG. 2), consequently, closed loop gain is formed. The capacity of the feedback capacitance C22 is settled equal to that of C21 (in FIG. 2), and the closed loop gain is settled as $-1$.

In the inverted amplifying portion INV2, I103 is connected at its output to the ground through a grounded capacitance C102 and I102 is connected at its output to the supply voltage and the ground through a pair of balancing resistances RE101 and RE102, respectively. Unstable oscillations of the inverted amplifying circuit including feedback circuit is prevented by such a structure.

As INV3, INV71, INV72 and INV9 are structured same as that of the INV2, they are omitted to be shown in figures.

Figure 12:
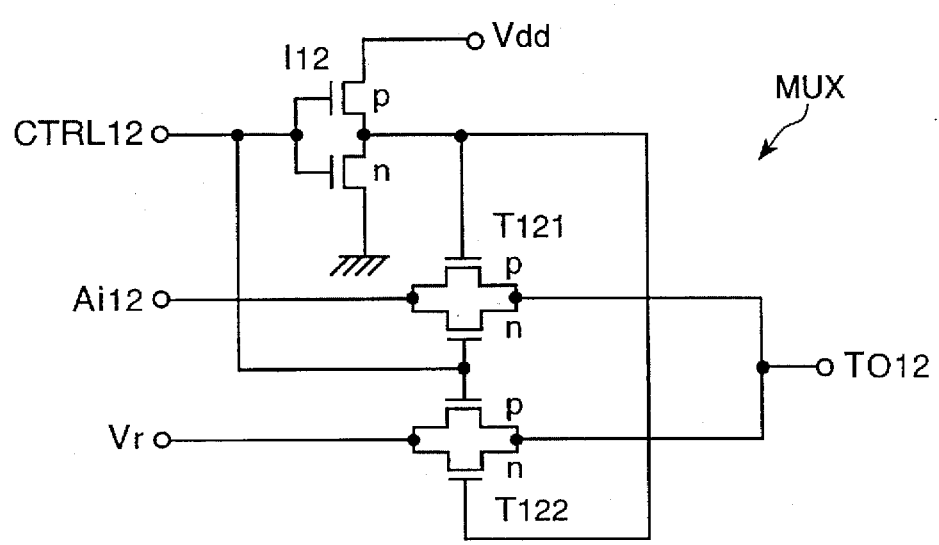
FIG. 12 shows a circuit of a multiplexer in the sampling and holding circuit in FIGS. 8 and 10.

As shown in FIG. 12, in the multiplexer MUX in FIG. 8, each of transistor circuits T121 and T122 is structured by connecting an nMOS transistor at its source and drain with pMOS transistor at its drain and source, respectively. Terminals of the source of the nMOS transistor in both transistor circuits are connected to the common output terminal TO12, and the input voltage Ai8 shown in FIG. 8 (Ai12 in FIG. 12) is connected to a terminal of the drain of nMOS transistor of T121. The reference voltage Vr is connected to a terminal of the drain of nMOS transistor of T122. A control signal CTRL12 is input to a gate of nMOS transistor of the transistor circuit T121 and a gate of pMOS transistor of the transistor circuit T122. A signal of inverted CTRL12 by an inverter I12 is input to gate of pMOS of T121 and nMOS of T122. Consequently, when CTRL12 is high level, T121 is conductive and T122 is cut off, and when low level, T122 is conductive and T121 is cut off. That is, MUX can alternatively output Ai12 or Vr by the control of CTRL12. As multiplexers MUX91 and MUX92 in FIG. 10 are structured in the same way as that of MUX, the description is omitted.

Figure 13:
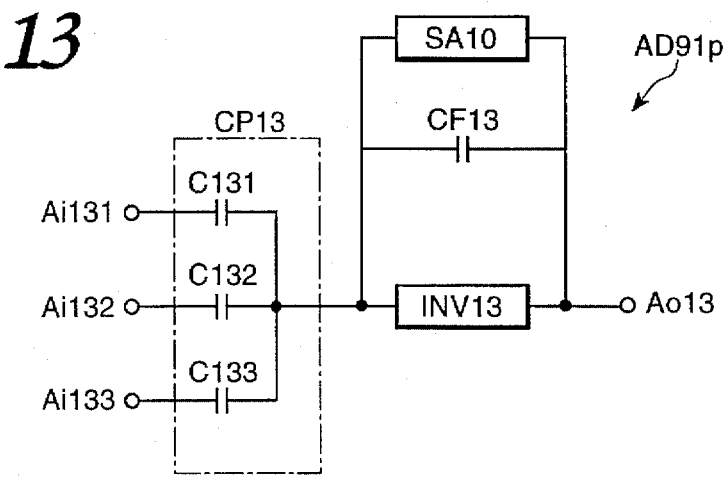
FIG. 13 shows a circuit of the first addition circuit in the accumulation circuit in FIG. 9.

As in FIG. 13, an addition portion AD91$p$ (AD91$m$ has the same structure) includes a capacitive coupling CP13 comprehending capacitances of the number corresponding to the number of sampling and holding circuits in a group, C131, C132 and C133. An output of CP13 is connected to INV13 which is the same as INV2, and is output as an output voltage Ao13 with good linearity.

Assuming input voltages of capacitances C131 to C133 to be Ai131, Ai132 and Ai133, and a feedback capacitance of INV13 to be CF1, Ao13 of an output of INV13 is expressed as in the formula (2)

$$Ao_{13} = -\frac{C_{131}Ai_{131} + C_{132}Ai_{132} + C_{133}Ai_{133}}{CF_{13}} \quad (2)$$

Here, Ai131 to Ai133 and Ao133 are the voltage referencing the reference voltage Vr, and it is settled that C131=C132=C133=CF13/3. A normalized output of inverse value of addition can be obtained as in formula (3). It is prevented that the maximum voltage exceeds the supply voltage by the normalization.

$$Ao_{13} = -\frac{Ai_{131} + Ai_{132} + Ai_{133}}{3} \quad (3)$$

Figure 14:
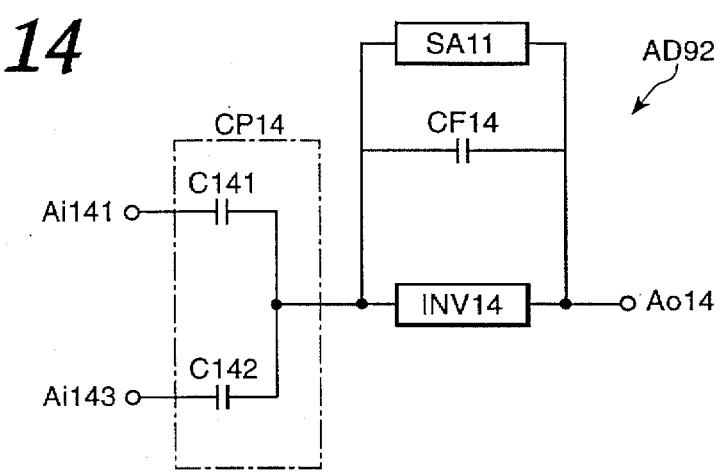
FIG. 14 shows a circuit of the second addition circuit in the accumulation circuit in FIG. 9.

As in FIG. 14, an addition portion AD92 includes a capacitive coupling CP14 comprehending capacitances of the number corresponding to the number of connected sampling and holding circuits, C141 and C142. An output of CP14 is connected to INV14 which is the same as INV2, and is output to an output of INV14 with good linearity.

Assuming input voltages of capacitances C141 and C142 to be Ai141 and Ai142, and a feedback capacitance of INV14 to be CF14, an output Ao14 of INV14 is expressed as in the formula (4)

$$Ao_{14} = -\frac{C_{141}Ai_{141} + C_{142}Ai_{142}}{CF_{14}} \quad (4)$$

Here, Ai141, Ai142 and Ao14 are the voltage referencing the reference voltage Vr, and it is settled that C141=C142= CF14/2. A normalized output of inverse value of addition can be obtained by it as in formula (5). It is prevented that the maximum voltage exceeds the supply voltage by the normalization.

$$Ao_{14} = -\frac{Ai_{141} + Ai_{142}}{2} \quad (5)$$

Figure 15:
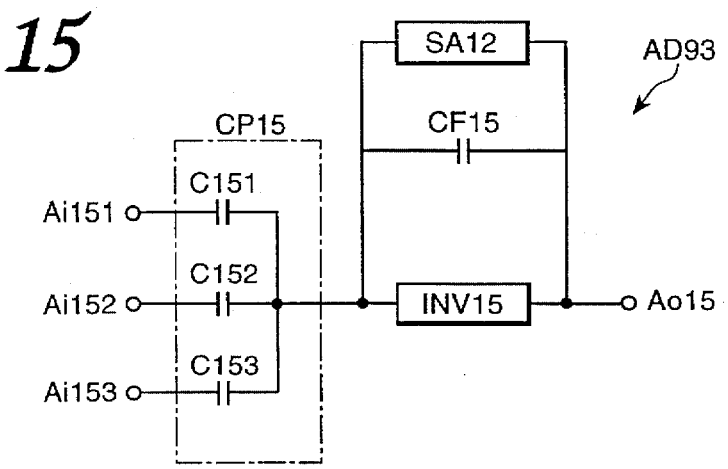
FIG. 15 shows a circuit of the third addition circuit in the accumulation circuit in FIG. 9.
Figure 16:
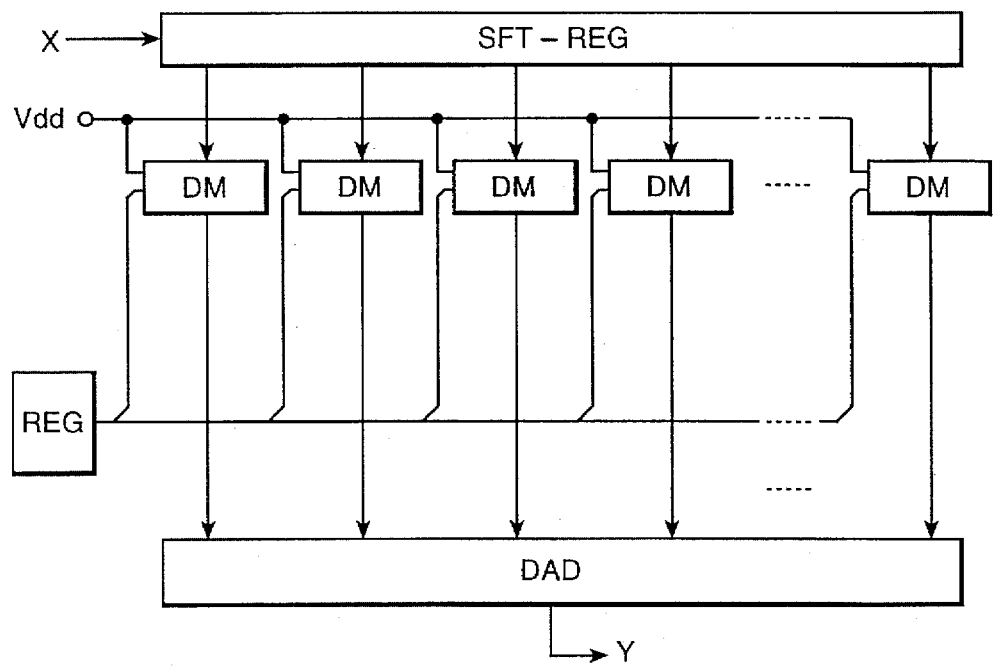
FIG. 16 shows a block diagram of conventional digital matched filter.

As in FIG. 15, an addition portion AD93 includes a capacitive coupling CP15 comprehending capacitances of the number corresponding to the number of circuits connected to AD93, two AD91$p$, two AD91$m$ and AD92, C151, C152 and C153. An output of CP15 is connected to INV15 which is the same as INV2, and is output to an output of INV1 with good linearity.

Assuming input voltages (referencing Vr) of capacitances C151 to C153 to be Ai151, Ai152 and Ai153, and a feedback capacitance of INV15 to be CF15, Ao13 of an output of INV15 is expressed as in the formula (6)

$$Ao_{15} = -\frac{C_{151}Ai_{151} + C_{152}Ai_{152} + C_{153}Ai_{153}}{CF_{15}} \quad (6)$$

It is settled that C151=C152=C153/2=CF15/2. A normalized output of inverse value of addition can be obtained by it as in formula (7). It is prevented that the maximum voltage exceeds the supply voltage by the normalization. The weight of C153 is twice as weights of C151 and C152 in order to reduce the influence of the normalization of AD92. The output of C153 is adjusted to be balanced with unnormalized Ao13 and Ao14.

$$Ao_{15} = -\frac{Ai_{151} + Ai_{152} + 2Ai_{153}}{2} \quad (7)$$

Generalizing the calculation of AD91$p$, AD91$m$, AD92 and AD93, Ao14 of the output of AD92 and Ao15($t$) of the output of AD93 are expressed in formulas (8) and (9), respectively, in which assuming a signal CTRL9 for i-th S/H9$i$ to be CTRL 9($i$) and its inversion to be ICTRL9($i$).

$$Ao14 = \frac{1}{N} \sum_{i=0}^{N-1} \frac{ICTRL9(i)+1}{2} V(t-i\Delta t) \quad (8)$$

$$Ao15(t) = -\frac{1}{N} \left\{ NA_0 14 - \sum_{i=0}^{N-1} \frac{ICTRL9(i)+1}{2} V(t-i\Delta t) \right\} \quad (9)$$

That is, it is the same that formula (10) is executed.

$$Ao15(t) = \frac{1}{N} \sum_{i=0}^{N-1} \frac{CTRL9(i)V(t-i\Delta t) - ICTRL(i)V(t-i\Delta t)}{2} \quad (10)$$

Here,
CTRL9($i$)=1 or CTRL9($i$)=-1,
when CTRL9($i$)=1, ICTRL9($i$)=-1,
when CTRL9($i$)=-1, ICTRL9($i$)=1.

Switches SA1 to SA12, SB1, SB7 to SB14 are for refreshing the circuit, and can cancel an offset voltage caused by a leak of electric charge or others. The switch of supply voltage SWS is for stopping supply voltage of the sampling and holding circuit etc. when possible for reducing electrical consumption. Even when the switch for refreshing is omitted, the output is usually enough accurate.

In a matched filter circuit according to the present invention, the function speed of an A/D converting circuit is minimized by intermittently holding an analog output signal according to an experience that peak detection can be performed by partially sampling the signal after the acquisition. Therefore, it is possible to use a circuit of rather low speed as an A/D converting circuit by the matched filter circuit according to the present invention. Therefore, it is profitable considering the cost, yield and electric power consumption.

What is claimed is:

1. A filter circuit for communication comprising:
   i) a means for addition and multiplication for
      a) sequentially holding an analog input signal by a plurality of a first sampling and holding circuits,
      b) performing weighted addition by PN code of said analog input signal on each holding point, and
      c) outputting an addition result as an analog output signal,
   i) a peak detecting portion for deciding a timing to take said signal according to a peak of said analog output signal; and
   ii) an A/D converter for converting said analog output signal into a digital signal, comprising;
      a) a second sampling and holding circuit for holding a signal only on said timing to take said signal, and
      b) a quantizing portion for digitizing an output of said second sampling and holding circuit.

2. A filter circuit for communication as claimed in claim 1, wherein said second sampling and holding circuit comprises:
   i) a plurality of third sampling and holding circuits corresponding to a plurality of peaks;
   ii) a plurality of switches for alternatively outputting one of outputs of said third sampling a holding circuits or a reference voltage; and
   iii) a controller for controlling a holding timing of said third sampling
      and holding circuits and a timing of opening and closing of said switches.

* * * * *